United States Patent [19]
Rinehart

[11] Patent Number: 5,687,072
[45] Date of Patent: Nov. 11, 1997

[54] LOW INDUCTANCE INVERTER

[75] Inventor: Lawrence E. Rinehart, Milpitas, Calif.

[73] Assignee: SemiPower Systems, San Jose, Calif.

[21] Appl. No.: 539,248

[22] Filed: Oct. 5, 1995

[51] Int. Cl.$^6$ ............................................. H02M 7/538
[52] U.S. Cl. ............................................. 363/132
[58] Field of Search ............................. 363/131, 132; 326/27, 33

[56] References Cited

U.S. PATENT DOCUMENTS

| | | | |
|---|---|---|---|
| 4,458,305 | 7/1984 | Buckle et al. | 363/141 |
| 4,816,984 | 3/1989 | Porst et al | 363/56 |
| 4,891,686 | 1/1990 | Krausse, III | 174/252 |
| 5,025,360 | 6/1991 | Latos | 363/16 |
| 5,164,893 | 11/1992 | Lüscher et al. | 363/137 |
| 5,172,310 | 12/1992 | Deam et al. | 363/132 |
| 5,471,089 | 11/1995 | Nagatomo et al. | 257/691 |
| 5,528,073 | 6/1996 | Gilmore | 257/584 |

OTHER PUBLICATIONS

Low Inductance Module Construction for High Speed, High Current by Tetsujiro Tsunoda, Tadashi Matsuda, Yoshikuni Nakadaira, Hirofumi Nakayama, Yorimichi Sasada, ISPSD '93.

*Primary Examiner*—Stuart N. Hecker
*Attorney, Agent, or Firm*—David H. Jaffer

[57] ABSTRACT

A physical construction of an inverter of the type having a positive voltage line and a negative voltage line interconnected by one or more switch sections. Each section includes two switch circuits, each having a transistor in parallel with a diode. The two switch circuits are connected in series, with the connection between the circuits providing an output to drive a load. The positive voltage line includes a positive voltage rail positioned closely to a negative voltage rail which is part of the negative voltage line. The close proximity of the two rails causes an electrical coupling between the positive and negative voltage lines. Current paths including circuit traces and bond wires within the inverter are arranged to place paths having oppositely directed currents, or equal and opposite di/dt's, in close parallel proximity resulting in mutual coupling and reduction in parasitic inductances. This construction results in a substantial reduction in the inductances of the various lines, with a corresponding reduction in switching voltage peaks, and an increased power and operational frequency capability.

7 Claims, 7 Drawing Sheets

LOW INDUCTANCE INVERTER

BACKGROUND OF THE INVENTION

1. Field of the Invention

The present invention relates generally to inverter circuits, and more particularly to an inverter circuit having reduced parasitic inductances, and still more particularly to an inverter circuit wherein the positive and negative voltage lines are positioned in close proximity resulting in reduced parasitic inductances.

2. Brief Description of the Prior Art

Figure 1:
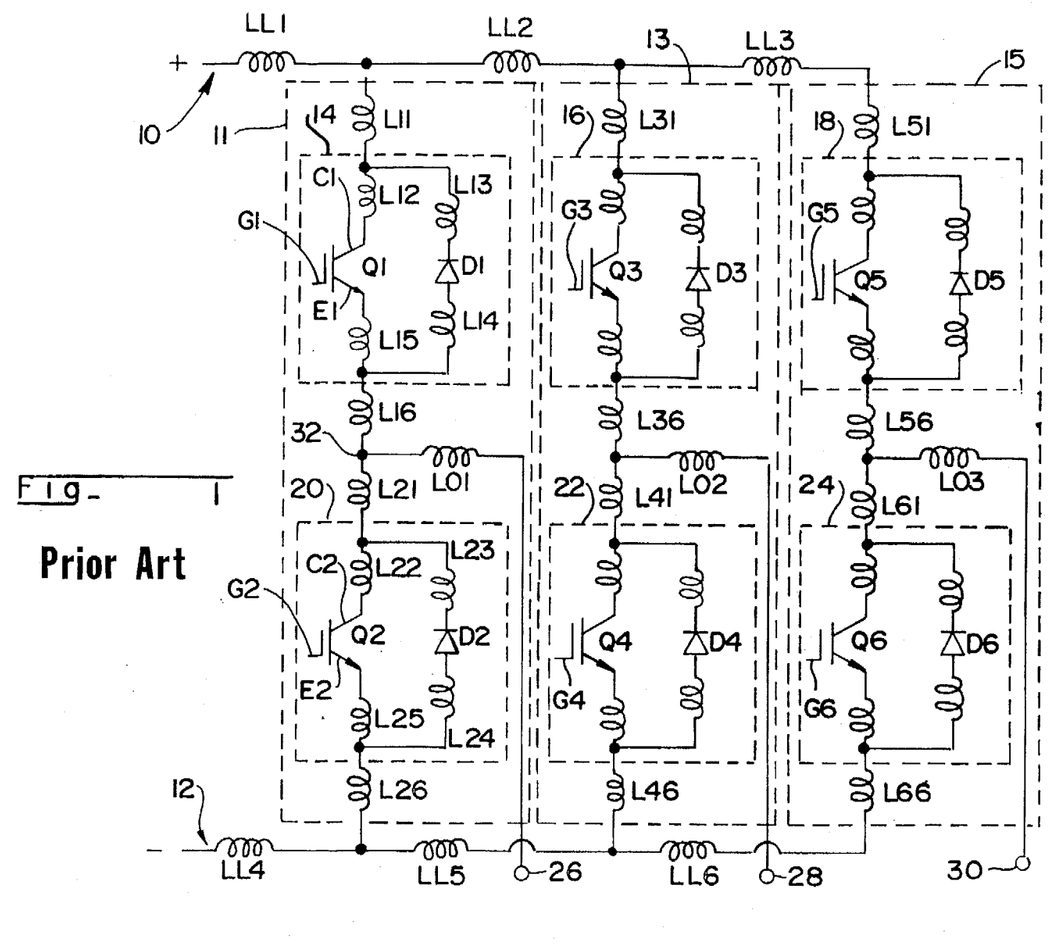
FIG. 1 is a schematic of a typical inverter circuit, including parasitic inductances due to bond wires, package pins, and physical PCB or hybrid circuit traces.

Inverter circuits commonly used for switching power from a source to a number of loads are limited in their ability to supply large amounts of power at high frequencies due to unwanted parasitic inductances in the circuitry. A typical inverter circuit for operation of a three-phase motor is shown in FIG. 1, including the various parasitic inductances. When the inverter switches the transistors on and off, the parasitic inductances cause voltage peaks to occur across the transistors, and/or diodes which can exceed the breakdown voltage and cause failure. One solution to this problem is to use snubber circuits connected in parallel with each transistor, but the size, weight, cost and reduction in efficiency are undesirable in many applications.

Limitations of some prior art approaches are discussed in U.S. Pat. No. 5,025,360 by Latos, which also discloses an apparatus for improving performance through use of additional diodes located physically close to each transistor. In U.S. Pat. No. 4,816,984, a circuit configuration is disclosed that provides negative feedback to the base circuit so as to slow down the switching speed, resulting in a reduction of the di/dt and corresponding voltage overshoot. This reduction in transient voltage generated by parasitic inductances is done at the expense of a slower switching speed and operational frequency and reduced power conversion system efficiency.

Due to a demand for smaller, low cost, high speed and high power motor drives, there is a need for an improved inverter circuit having a minimum number of circuit components while providing operation at high speed and power.

SUMMARY OF THE INVENTION

It is therefore an object of the present invention to provide an improved inverter circuit capable of operation at both high frequency and high power.

It is a further object of the present invention to provide a low cost inverter circuit having a minimum of circuit components.

Briefly, a preferred embodiment of the present invention includes a physical construction of an inverter of the type having a positive voltage line and a negative voltage line interconnected by one or more switch sections. Each section includes two switch circuits, each having a transistor in parallel with a diode. The two switch circuits are connected in series, with the connection between the circuits providing an output to drive a load. The positive voltage line includes a positive voltage rail positioned closely to a negative voltage rail which is part of the negative voltage line. The close proximity of the two rails, carrying substantially equal and opposite currents during switching from one circuit to the other, causes an electrical coupling between the positive and negative voltage lines. Current paths including circuit traces and bond wires within the inverter are arranged to place paths having oppositely directed currents, or equal and opposite di/dt's in close parallel proximity resulting in mutual coupling and reduction in parasitic inductances. This construction results in a substantial reduction in the inductances of the various lines, with a corresponding reduction in switching voltage peaks, and an increased power and operational frequency capability.

An advantage of the present invention is a lower cost and smaller sized inverter due to fewer components.

A further advantage of the present invention is the provision of an inverter that is low cost, small in size and capable of high power and high frequency operation.

DETAILED DESCRIPTION OF THE PREFERRED EMBODIMENT

Figure 3:
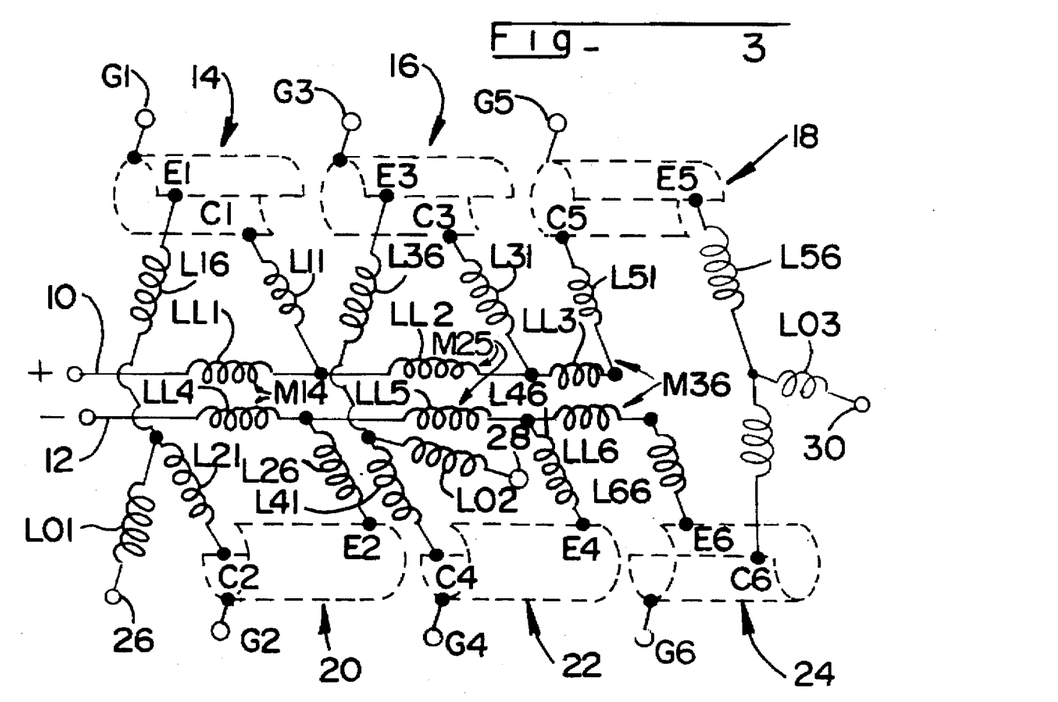
FIG. 3 shows a pseudo-schematic illustrating the principal of locating the positive and negative voltage lines closely together.
Figure 4:
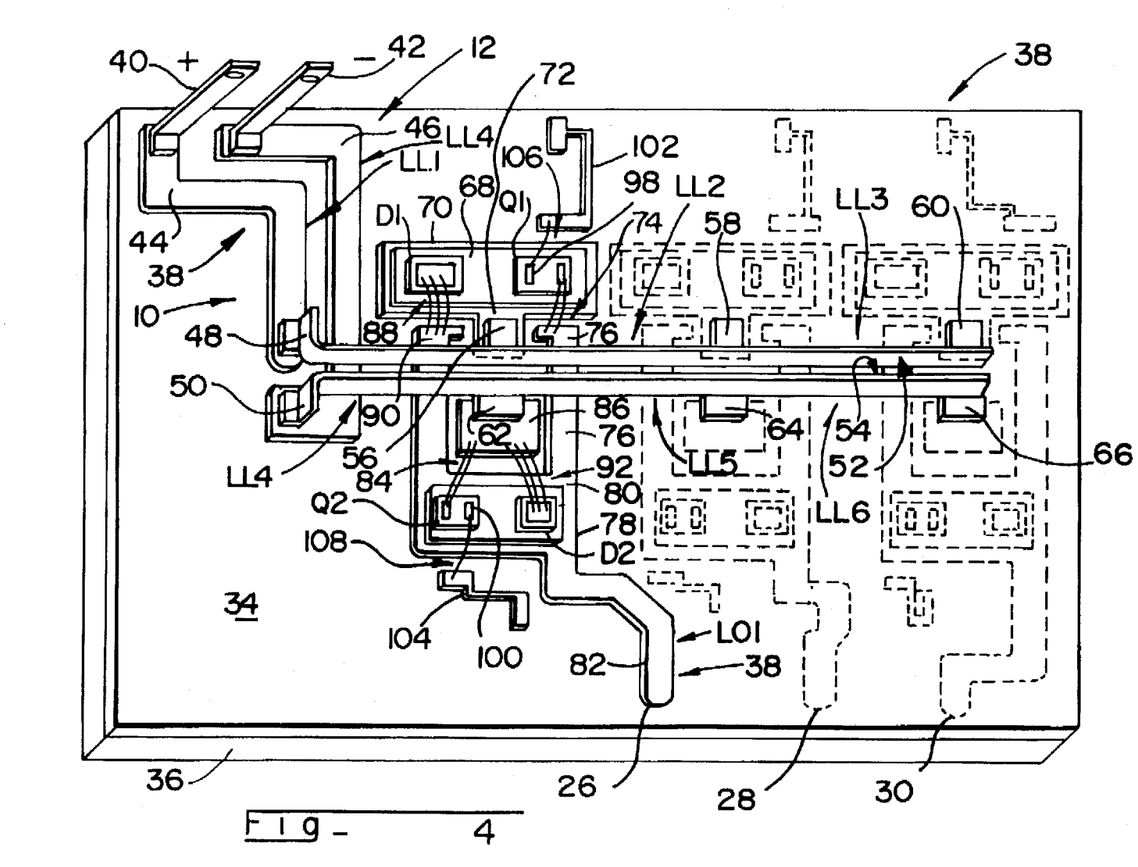
FIG. 4 is a perspective view of a preferred embodiment of the invention.

A feature of the preferred embodiment of the present invention is shown in pseudo-physical, schematic form in FIG. 3. The purpose of FIG. 3 is to aid in understanding the actual physical layout shown in FIG. 4. FIGS. 3 and 4 show the inventive concept as applied to the electrical schematic of FIG. 1. The invention also applies to other types of switching circuits. For example, a number of other types of switching devices are available, and they could be substituted for the insulated gate bipolar transistor shown, and/or the circuit could include other numbers of switching sections. The device as illustrated has three switching sections, but the invention applies as well to any number, more or less than three.

Figure 2:
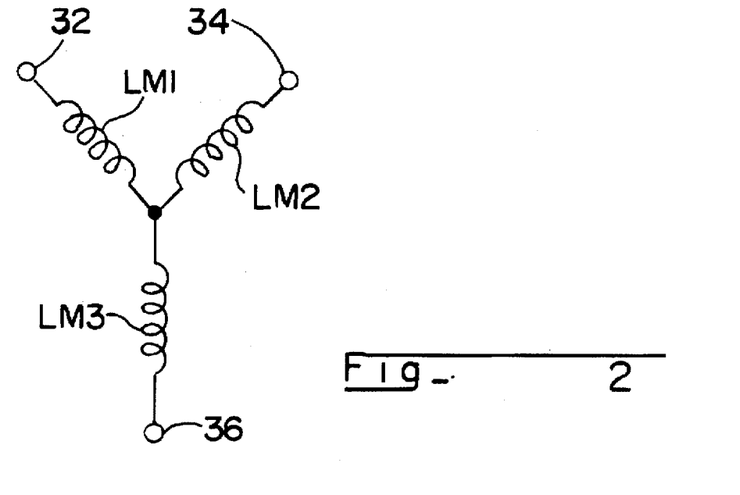
FIG. 2 shows the coils of a three-phase motor.

Referring now to FIG. 1 in more detail, the inductances LL1 through LL6 represent the equivalent inductances of portions of the positive and negative voltage lines 10 and 12. Each of the switch circuits 14–24 are shown to include an insulated gate bipolar transistor Q1–Q6 and a diode D1–D6. The parasitic inductances L11–L16, L21–L26, L31–L36, L41–L46, L51–L56, L61–L66 are representations of the various leads, connections, etc. involved in interconnection of the transistors, diodes and voltage lines. L01, L02, and L03 represent the inductance of leads making interconnection to the loads being driven. A typical load for the circuit of FIG. 1 would be the phase windings of a three-phase motor, illustrated schematically in FIG. 2. In operation, the outputs 26, 28, 30 of the inverter of FIG. 1 would be connected to terminals 32, 34, 36 respectively of FIG. 2, for driving windings LM1, LM2, and LM3. The switch circuits 14 and 20 form a switching pair, operative upon application of control signals on G1 and G2 to alternately connect point 32 electrically to line 10 or line 12. During the switching operation, large and rapid current changes occur in the various inductances, resulting in a voltage e=L di/dt across them, "e" representing the voltage across a particular inductance L. These voltages can be very large, and cause correspondingly large voltages to be applied across the switching circuits 14–24 which could destroy the switching devices, such as transistors Q1–Q6.

As noted in the discussion of the prior art, an object of circuit design is to try and minimize the value of the parasitic inductances. The largest of these inductances are usually those in the positive and negative voltage lines 10 and 12. An objective of the present invention is to provide a construction that minimizes these inductances. It should be noted that the use of positive and negative will be applied to the description of the preferred embodiments. Although such an arrangement is indicated as preferred, other voltage polarities for the two lines are included in the spirit of the invention. For example, line 10 could be positive, and line 12 could be ground.

Referring now to FIG. 3, a pseudo-physical schematic is shown, illustrating a novel concept of the present invention. The intent of FIG. 3 is to take the schematic of FIG. 1 and show the positive and negative voltage lines 10 and 12 positioned physically close to each other, while retaining the schematic illustration of the elements. In order to accomplish this, each of the switch circuits 14–24 are shown folded in the schematic, illustrating that the lines 10 and 12 are to be located physically close together. Prior art circuit board layouts of the circuit of FIG. 1 have the components positioned approximately as shown in the schematic. The novel arrangement of FIG. 3 turns the circuit "outside-in", putting the outside inductances LL1 through LL6 in the center of the circuit board layout, which will be fully explained in the following figures of the drawing. Laying the circuit out as shown in FIG. 3 introduces new parasitic elements in the form of mutual inductances that couple various circuit elements together. For example, M14 in FIG. 3 is a mutual inductance representing the coupling between LL1 and LL4 due to their close proximity, as are M25 and M36. Other elements are also coupled together as a result of the folding, or outside-in configuration and the particular layout of the circuit board which will be shown in the following figures of the drawing. The schematic of FIG. 3 shows the inductances L16 and L36 passing under lines 10 and 12. The arrangement of FIG. 3 is given as an example. Other arrangements of the schematic that result in coupling of lines 10 and 12 are included in the spirit of the present invention.

When the switching circuits 14–24 are in the process of changing state from on to off and off to on, large current changes occur in the corresponding inductances LL1–LL6 of the positive and negative voltage lines. The currents occurring in inductances LL1, LL2 and LL3 of the positive line 10 are substantially equal in magnitude and opposite in direction to the currents in LL4, LL5 and LL6 of the negative line. It was found that when lines 10 and 12 are electrically coupled by being placed in close proximity, there occurs a field cancellation, resulting in a reduction of the effective value of parasitic inductances LL1–LL6. This principle of positioning lines closely together having oppositely directed currents to reduce parasitic inductances can be applied throughout an electronic circuit according to the spirit of the present invention. This principle will be more fully described in relation to the preferred embodiment of the present invention in relation to FIG. 6.

Figure 5:
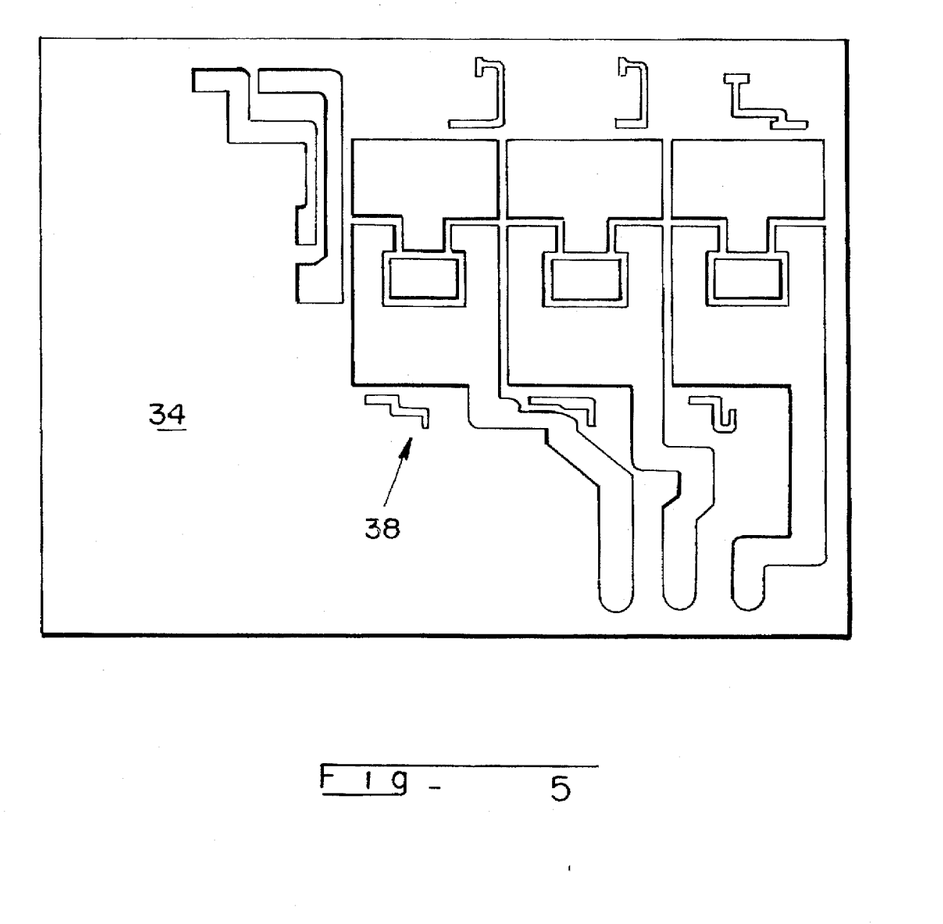
FIG. 5 shows the printed circuit board conductive traces.

FIG. 4 is a perspective view of the construction of a preferred embodiment of the present invention corresponding to the schematics of FIGS. 1 and 3. There is a thin electrically insulating layer 34 shown attached to a thermally conducting base 36. The layer 34 has electrically conductive traces 38 thereon. Refer to FIG. 5 for a view of the circuit traces 38 without other components and wiring masking the view.

The positive voltage line 10 of FIG. 3 is shown in FIG. 4 to consist of terminal 40, line 44, and rail 48. Similarly, the negative voltage line 12 consists of terminal 42, line 46 and rail 50. The rails 48 and 50 are mounted so as to be in close proximity, having the broad surfaces 52 and 54 lying closely parallel to each other. This structure results in the rails 48 and 50 being electrically coupled together. The inductance LL1 of FIGS. 1 and 3 is shown in FIG. 4 to include terminal 40, line 44 and that part of rail 48 extending from line 44 to tab 56. Inductance LL2 includes that portion of rail 48 from tab 56 to tab 58, and inductance LL3 includes that portion from tab 58 to tab 60.

The inductance LL4 includes terminal 42, line 46 and that portion of rail 50 extending from line 46 to tab 62. Inductance LL5 includes that portion of rail 50 from tab 62 to tab 64, and inductance LL6 includes that portion of rail 50 from tab 64 to tab 66.

Transistor Q1 is shown mounted to a conductive slab 68, which is mounted to conductor 70. Conductor 70 has an extension 72 upon which tab 56 is mounted. Inductance L11 of FIG. 3 is included in, but not limited to, extension 72 and tab 56. Inductance L16 is included in wire 74 and trace 76, which passes under the rails 48 and 50 to conductor portion 78. Conductor 78 is attached to slab 80, upon which transistor Q2 is mounted. Inductance L21 is included in the connective structure from the collector of the transistor Q2 to the conductor 78. L01 is included in the conductor 82. L26 of FIG. 3 is included in wires 84, conductive pad 86 and tab 62.

The above elements in relation to FIGS. 3 and 4 describe the circuit interconnection with the rails 48 and 50. Referring again to FIG. 1, the remaining equivalent circuit elements within the switch circuits 14–24 can be roughly identified relative to their physical embodiment in FIG. 4. L12 and L13 are parasitic inductances from the collector (bottom side) of Q1 and the diode D1 (bottom side) to some point on the conductor 70. L14, L15 and L16 of FIG. 3 are an equivalent circuit for the physical elements of FIG. 4 including wire bonds 88 and 74 and conductive traces 76 and 90 to some point on the conductor 78 joined by L01 (primarily conductor 82) and the path from diode D2 and transistor Q2. Similarly, L21, L22 and L23 are an equivalent circuit for the connections from diode D2 and the collector of Q2 to the connection of L01, where L01 includes conductor 82. The elements L24, L25 and L26 are an equivalent circuit for the connections from the emitter of Q2 and the diode D2 to the line 12, and are included in the wires 84, 92, conductor 86 and tab 62.

The circuit of FIG. 4 also shows the gates G1 and G2 of FIG. 3 as elements 98 and 100 interconnected to traces 102 and 104 with bond wires 106 and 108. The traces 102 and 104 provide connection means for applying drive signals to turn the transistors Q1, Q2 off and on. Switching circuits 14 and 20 are included in switch section 11. Two other switch sections 13 and 15 are shown in FIGS. 1, 3 and 4. The switch sections 13 and 15 are constructed in a similar manner to section 11, and detailed description is therefore not needed. The description of section 15 is slightly different from sections 11 and 13 in that the line 106 does not go under the rails 48 and 50 which do not extend that far.

Figure 6:
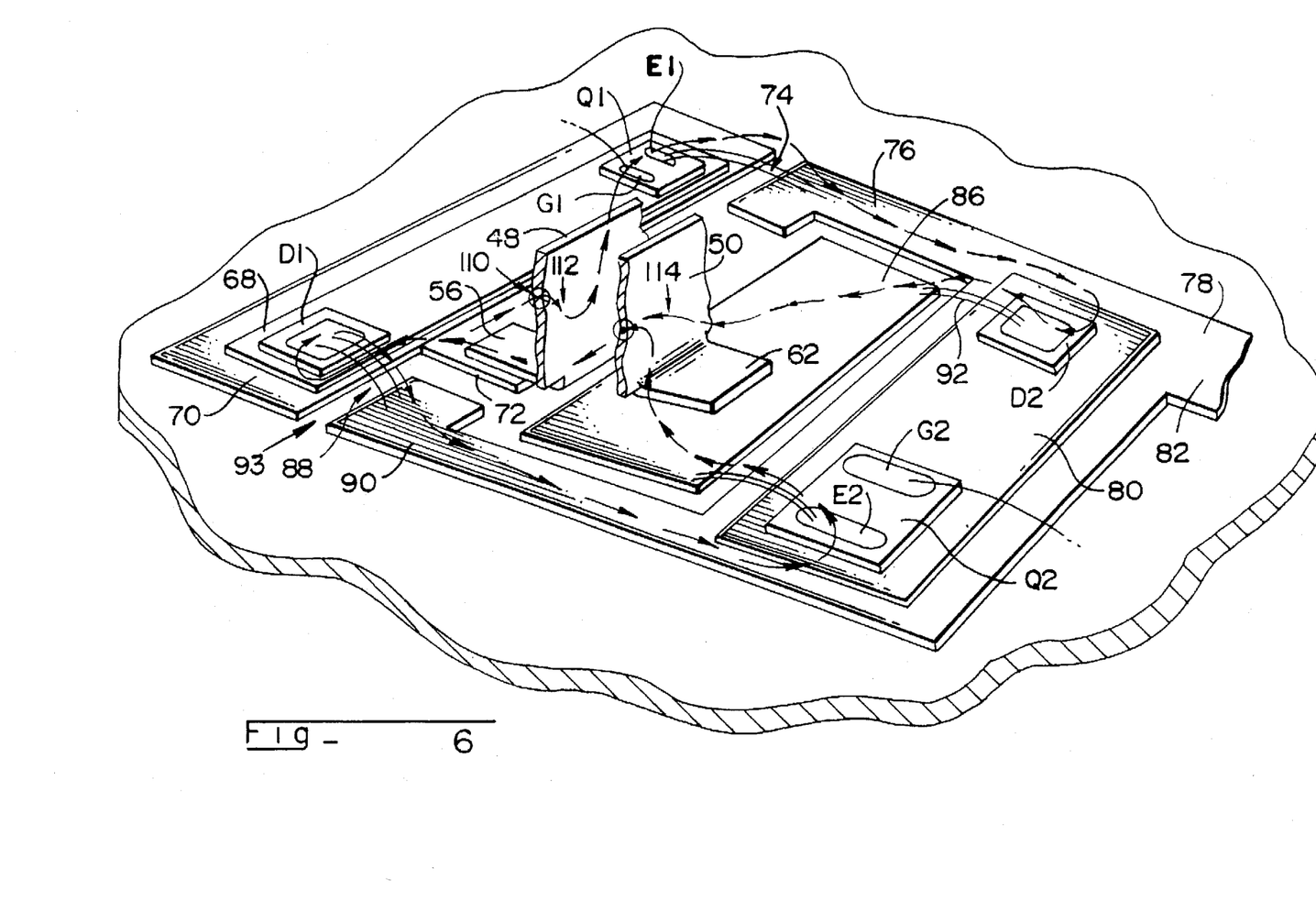
FIG. 6 shows the current flow paths for a hybrid implementation of the invention.

FIG. 6 shows a portion of the first switch section of FIG. 4, enlargened for use in clarifying the principle of reduction of parasitic inductances by arranging the components so as to place substantially equal and opposite currents adjacent to each other.

The dashed lines with arrows in FIG. 6 indicate the flow of current as detailed in the following description. Following an approximate path, for demonstration purposes, current can be considered as entering line 48 in FIG. 6 at point 110, flowing along rail 48 at 112, demonstrably opposite to the flow at point 114 in the rail 50. The current flows through tab 56, extension 72 and conductor 70 to the diode D1. The current then changes direction, flowing through wires 88 and trace 90 in parallel with and in an opposite direction to the flow from line 48 to diode D1. The current path then continues through trace 90 to diode Q2 running closely parallel and opposite in direction to the path through wires 84, conductor 86 and tab 62.

Turning attention again to line 48, the current from line 48 also passes through tab 56, extension 72, and conductor 70 to transistor Q1, flowing through a path which lies closely parallel and in an opposite direction to current flowing through wires 74 and trace 76. The path through trace 76 to diode D2 lies closely parallel to, and flows in an opposite direction to the current in the path through wires 92, conductor 86 and tab 62 to rail 50.

The layout, as described above, is arranged at all points to maximize the amount of field cancellation by running wires in sets with equal and oppositely directed current paths lying closely to each other creating mutual inductances or coupling between paths carrying currents flowing in opposite direction. For example, extension 72 and trace 90 are purposely laid out close to each other with small gaps at 91 and 93 to achieve a mutual inductance (coupling) between them. This close spacing of lines carrying currents flowing in opposite directions also applies between the extension 72 and trace 76, and conductor and traces 76 and 90. This arrangement minimizes the parasitic inductances in the circuit and the corresponding voltage peaks manifested in operation, and maximizes the switching speed. The various elements in the schematic of FIG. 1 can be approximately identified with areas in the physical layout of FIGS. 4 and 6. This equivalence is approximate, because the boundaries are not well defined in the physical layout, the various parts, diodes and transistors having dimensions of their own which become part of the parasitic inductances of FIG. 1. For example, L11 and L13 include part of rail 48, extension 72 and conductor 70. L14 and L16 includes portions of conductor 70, trace 90 and conductor 78. The other relationships between the elements of the schematic of FIG. 1 and physical layout of FIGS. 4 and 6 will be apparent to those skilled in the art after reading this specification.

Referring again to FIGS. 1, 4 and 6, the functional qualities of the physical layout will be more fully explained in relation to the electrical operation of the inverter. Referring to the transistor and diode positions as shown in FIG. 4, transistor Q1 is located to the right side of the upper slab 68, and diode D2 is located on the right side of the lower slab 80. Similarly, D1 is located on the left side of the upper slab 68 and Q2 is located on the left side of the lower slab 80. This positioning of the transistors and diodes is done in order to minimize the parasitic inductances during turn-on and turn-off of the transistors.

Referring now to the schematic circuit of FIG. 1, when diode Q2 is turned on and the current in diode D1 is commutated, there is a significant reverse recovery transient where D1 conducts in the negative direction. As a result there is a large pulse of current through Q2, well in excess of the load current flowing out of L01. The object of the layout of FIG. 4 is to introduce coupling between circuit inductances in order to minimize the effective inductances seen by the current, and the corresponding stored energy $Li^2/2$ dissipated in the circuit as soon as the transient is over. Upon turn-on of Q2, current flows in a reverse direction through L11, D1, L14, L16, L21, Q2, L26 and back out LL4. D1 is placed on the same side as Q2, because in order to minimize the inductance, the current flowing down trace 90 from D1 is placed in close proximity to the current flowing out of the emitter of Q2 to the rail 50 via bond wires 84. These opposite flowing currents in close proximity result in substantial inductance cancellation. An example of the relative direction of current flow is illustrated by the dashed, arrowed lines in FIG. 6.

Comparing the schematic of FIG. 1 to the layout of FIGS. 4 and 6, it can be seen that part of L26 and L25 would be included in wires 84 and conductor 86, carrying current in one direction, and these are coupled to L16, L21 and L22 which, in part are included in trace 90 carrying circuit in an opposite direction. Similarly, wires 88 represented in part by L14, and a portion of trace 90, are represented in part by L16 carrying current in one direction, and are coupled to extension 72 and conductor 70 represented in part by L11 and L13 carrying current in an opposite direction. In contrast to the above improved layout, if D1 were put on the right side of slab 68, the current would travel down trace 76 and across conductor 78 to Q2, and there would be no coupling of currents flowing in opposite directions, and no inductance reduction. Referring again to FIGS. 4 and 6, a similar, mirror description applies to diode D2 and transistor Q1, where the current in trace 76 flows in an opposite direction in close proximity to the current in the wires 92 from the diode D2 to the rail 50. The wires 92 and 84 are run as closely as possible to and above the traces 90 and 76 respectively in order to achieve a mutual coupling between them.

Referring again to FIG. 1, the time the transistor turns off, for example when transistor Q2 is turned off, the current in L01 does not change very quickly because the load inductance (not shown) connected in series at 26 (FIG. 1) is very large in consideration of the switching time period. As a result, as the current in Q2 is ramping down, there is an opposite current ramping up through D1. These rapidly changing currents cause voltages across all of the parasitic inductances through which the current flows. These inductances need to be minimized in order to reduce the corresponding voltage transients. If these voltages are not minimized, they may rise above the breakdown voltage of Q2, burning it out. Also, any energy stored in parasitic inductances when the switch is on will be dissipated in the switch when it is turned off.

The problem of voltages across the parasitic inductances of FIG. 1, as just explained, is solved by the circuit layout of FIGS. 4 and 6, which provide coupling between current paths having equal and opposite rates of change of current di/dt. In order to reduce the self-inductances of a transistor emitter bond wire such as bond wires 84 of transmitter Q2, trace 90 carrying the current from diode D1 is placed under the wires As the emitter current decreases the diode current increases, i.e. the di/dt in the bond wires 84 is equal and opposite to the di/dt in the trace 90. This is true even though the currents are flowing in the same direction. As a result of the equal and opposite di/dt's, the magnetic field does not change significantly, and there is no energy stored and therefore no inductance. This situation is essentially an inverse of the field cancellation process used during turn-on of Q2 and benefits the circuit operation in a similar manner.

When Q2 is turned off there is a decrease of current in Q2 and a net increase of current in D1. This is the inverse of the case when the transistor is turned on.

Figure 7:
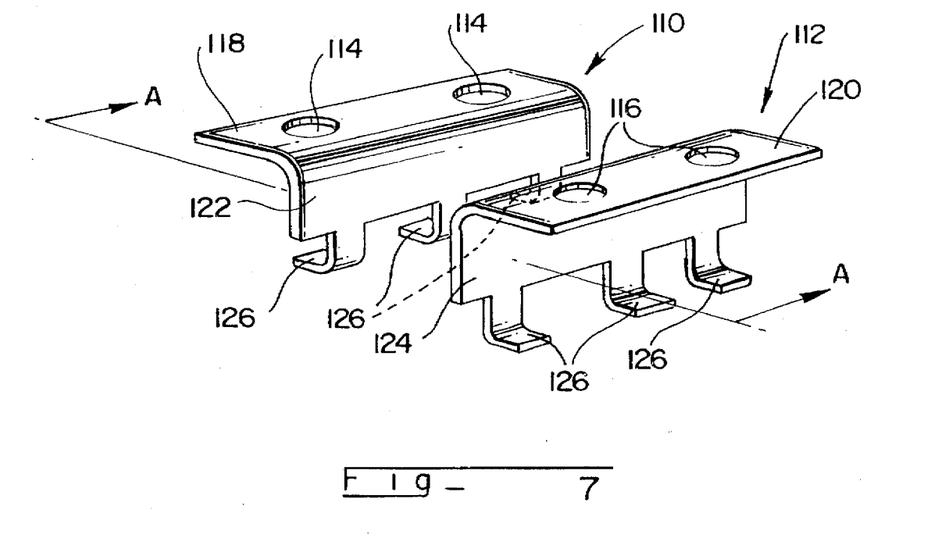
FIG. 7 illustrates alternate rails with a reduced inductance connection to supply voltages.

FIG. 7 shows an alternate embodiment of the rails 48 and 50 of FIGS. 4 and 6. The rails 110 and 112 of FIG. 7 differ from the rails 48 and 50 of FIG. 4 in the manner in which they are connected to the supply voltage or voltages. Connection is made via bolt holes 114 and 116 in flanged extensions 118 and 120, set at right angles to coupled rail portions 122 and 124. The rails 110 and 112 are mounted to circuit board (not shown) similar to circuit board 34 by way of tabs 126, similar to tabs 56–66 of FIG. 4. The flanged extensions 118 and 120 provide lower inductance connections, replacing the higher inductance combination shown in FIG. 4 of terminals 40, 42, lines 44, 46, and the portions of rails 48 and 50 that extend from tabs 56 and 62 to the lines 44 and 46. The advantage, again, is a faster switching speed resulting from the reduction in circuit parasitic inductances.

Figure 8:
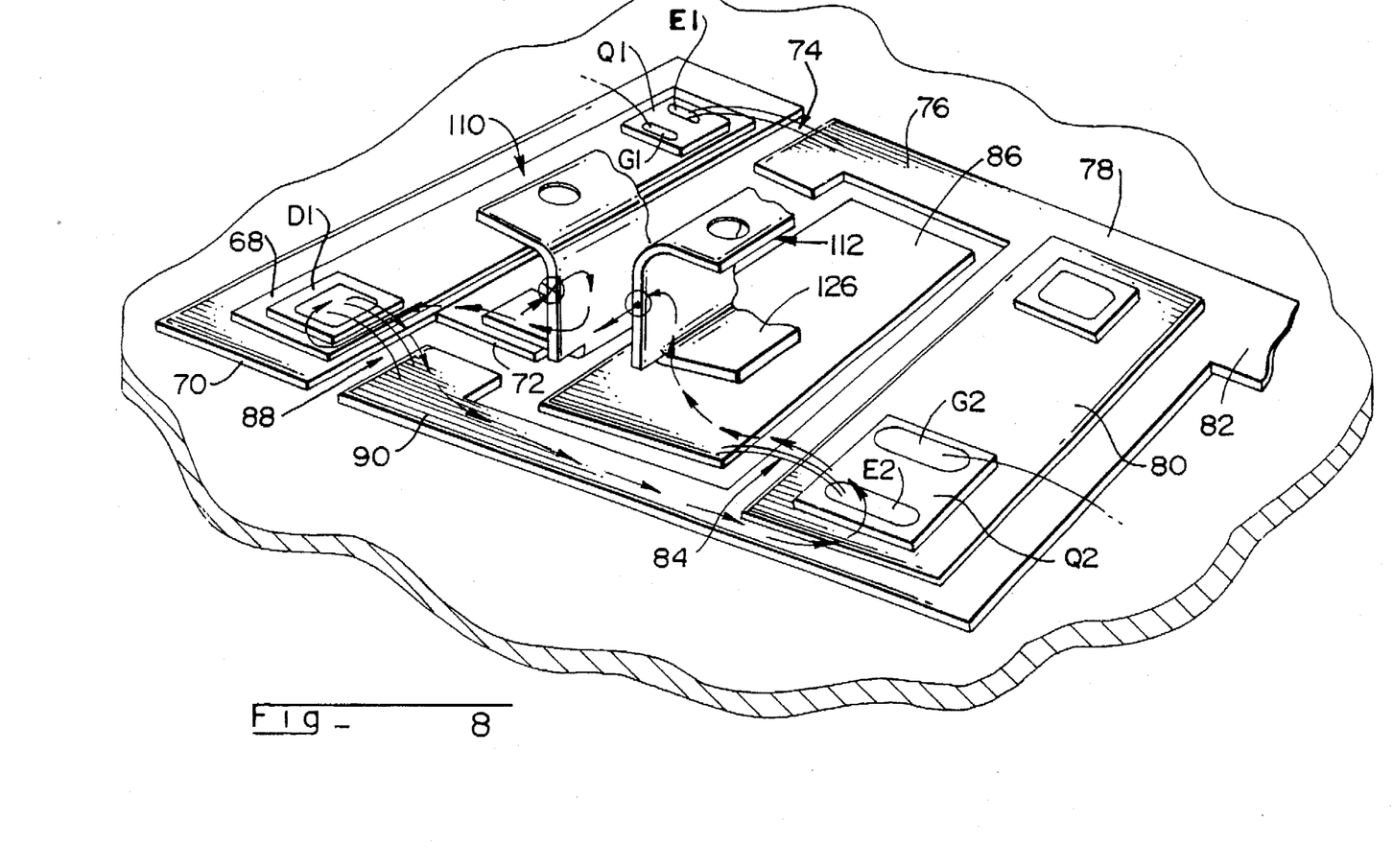
FIG. 8 shows a portion of the alternate rail of FIG. 7 attached to a circuit board.

FIG. 8 shows a view of a portion of the rails 110 and 112 mounted to a portion of the circuit board, showing the tabs 126 attached to pad 86 and extension 72. A transistor Q2 is shown mounted to slab 80, and diode D1 mounted to conductor 70. Bond wires 84 are shown connected from pad 86 to the emitter E2 of transistor Q2, and wires 88 from diode D1 to trace 90.

The layout described in relation to the figures is given by way of example. Other layouts or structures which accomplish the same principle are also included in the spirit of the present invention. Although a preferred embodiment of the present invention has been described above, it will be appreciated that certain alterations and modifications thereof will be apparent to those skilled in the art. It is therefore intended that the appended claims be interpreted as covering all such alterations and modifications as fall within the true spirit and scope of the invention.

What is claimed is:

1. An inverter circuit comprising:

(a) a printed circuit board means having a surface;

(b) first and second voltage rails positioned parallel to each other and above said printed circuit board surface, wherein said surface includes a first portion extending from said first voltage rail and a second portion extending from said second voltage rail;

(c) a plurality of switching pairs, each including a first switching circuit having semiconductor circuit components including a first diode and a first transistor, and a second switching circuit having semiconductor circuit components including a second diode and a second transistor, said first switching circuit positioned on said first portion of said printed circuit board surface, and said second switching circuit positioned on said second portion of said printed circuit board surface, and each said switching pair further including (i) a plurality of conductive circuit traces on said printed circuit board;

(ii) a plurality of bonding wires for interconnecting said semiconductor circuit components with said traces and said voltage rails;

wherein said wires and said traces are a plurality of conductors, including a first quantity of one or more said conductors carrying a current in a first direction during operation of said inverter, and a second quantity of one or more said conductors carrying a current in a second direction opposite to said first direction during operation of said inverter, and said first quantity and said second quantity are positioned so as to electrically couple, whereby inductances associated with said first quantity and said second quantity are reduced.

2. An inverter circuit as recited in claim 1 wherein said plurality of conductors further includes a third quantity of one or more of said conductors carrying a current that changes in magnitude in a third direction during operation of said inverter, and a fourth quantity of one or more said conductors carrying a current that changes in magnitude in a fourth direction opposite to said third direction during operation of said inverter, and said third quantity and said fourth quantity are positioned parallel and electrically coupled to each other, whereby an inductance of said third quantity and inductance of said fourth quantity are reduced.

3. An inverter as recited in claim 1 wherein each said switching pair includes (i) first conductor means including a first bonding wire connecting said first diode to a first trace on said printed circuit board, said first conductor means lying substantially perpendicular to and running under said first and second rails to connect with said second transistor;

(ii) second conductor means including a second bonding wire connecting said second transistor to a second trace, said second conductor means lying substantially parallel to said first conductor means and connecting to said second rail;

(iii) third conductor means including a third bonding wire connecting said first transistor to a third trace, said third conductor means lying substantially perpendicular to and running under said first and second rails to connect with said second diode;

(iv) fourth conductor means including a fourth bonding wire connecting said second diode to said second trace, said fourth conductor means lying substantially parallel to said third conductor means and connecting to said second rail;

(v) fifth conductor means connecting said first rail to said first diode, said fifth conductor means lying substantially parallel to said first conductor means;

(vi) sixth conductor means connecting said first rail to said first transistor, said sixth conductor means lying substantially parallel to said third conductor means.

4. An inverter as recited in claim 3 wherein each said switching pair further includes a load conductor connected to and extending from said third conductor means proximate to the connection of said third conductor means with said second diode for connection to a motor winding.

5. An inverter circuit comprising:

(a) a printed circuit board means having a surface;

(b) first and second voltage rails positioned parallel to each other and above said printed circuit board surface, wherein said surface includes a first portion extending from said first voltage rail and a second portion extending from said second voltage rail;

(c) a plurality of switching pairs, each including a first switching circuit having semiconductor circuit components including a first diode and a first transistor, and a second switching circuit having semiconductor circuit components including a second diode and a second transistor, said first switching circuit positioned on said first portion of said printed circuit board surface, and said second switching circuit positioned on said second portion of said printed circuit board surface, and each said switching pair further including
(i) a plurality of conductive circuit traces on said printed circuit board;
(ii) a plurality of bonding wires for interconnecting said semiconductor circuit components with said traces and said voltage rails;
wherein said wires and said traces are a plurality of conductors, including a first quantity of one or more said conductors carrying a current that changes in magnitude in a first direction during operation of said inverter, and a second quantity of one or more said conductors carrying a current that changes in magnitude in a second direction opposite to said first direction during operation of said inverter, and said first quantity and said second quantity are positioned so as to electrically couple,
whereby inductances associated with said first quantity and said second quantity are reduced.

6. An inverter as recited in claim 5 wherein each said switching pair includes
(i) first conductor means including a first bonding wire connecting said first diode to a first trace on said printed circuit board, said first conductor means lying substantially perpendicular to and running under said first and second rails to connect with said second transistor;
(ii) second conductor means including a second bonding wire connecting said second transistor to a second trace, said second conductor means lying substantially parallel to said first conductor means and connecting to said second rail;
(iii) third conductor means including a third bonding wire connecting said first transistor to a third trace, said third conductor means lying substantially perpendicular to and running under said first and second rails to connect with said second diode;
(iv) fourth conductor means including a fourth bonding wire connecting said second diode to said second trace, said fourth conductor means lying substantially parallel to said third conductor means and connecting to said second rail;
(v) fifth conductor means connecting said first rail to said first diode, said fifth conductor means lying substantially parallel to said first conductor means;
(vi) sixth conductor means connecting said first rail to said first transistor, said sixth conductor means lying substantially parallel to said third conductor means.

7. An inverter as recited in claim 6 wherein each said switching pair further includes
a load conductor connected to and extending from said third conductor means proximate to the connection of said third conductor means with said second diode for connection to a motor winding.

* * * * *